United States Patent [19]

Jewell

[11] Patent Number: 5,882,948
[45] Date of Patent: Mar. 16, 1999

[54] METHOD FOR FABRICATING A SEMICONDUCTOR DEVICE

[75] Inventor: Jack L. Jewell, Boulder, Colo.

[73] Assignee: Picolight, Inc., Boulder, Colo.

[21] Appl. No.: 965,009

[22] Filed: Nov. 5, 1997

Related U.S. Application Data

[62] Division of Ser. No. 659,942, Jun. 7, 1996, Pat. No. 5,729,566.

[51] Int. Cl.$^6$ .................................................. H05L 21/20
[52] U.S. Cl. ................................ 438/22; 438/38; 438/45; 438/46
[58] Field of Search .................... 438/38, 39, 47, 438/46, 767, 22, 45, 719, 34; 372/45, 46; 257/13

[56] References Cited

U.S. PATENT DOCUMENTS

| | | |
|---|---|---|
| 5,206,872 | 4/1993 | Jewell et al. . |
| 5,245,622 | 9/1993 | Jewell et al. . |
| 5,262,360 | 11/1993 | Holonyak, Jr. et al. . |
| 5,340,998 | 8/1994 | Kasahara . |
| 5,373,522 | 12/1994 | Holonyak, Jr. et al. . |
| 5,493,577 | 2/1996 | Choquette et al. . |
| 5,583,350 | 12/1996 | Norman et al. . |
| 5,606,572 | 2/1997 | Swirhun et al. . |
| 5,608,753 | 3/1997 | Paoli et al. . |

OTHER PUBLICATIONS

Dallesasse, et al., "Hydrolyzation Oxidaton of $Al_xGa_{1-x}As$–AlAs–GaAs Quantum Well Heterostuctures and Superlattices," Applied Physics Letters, vol. 57, pp. 2844–2846, 1990.

Yang et al., "Continuous Wave Single Transverse Mode Vertical–Cavity Surface–Emitting Lasers Fabricated by Helium Implantation and Zinc Diffusion," Electronics Letters, vol. 28, pp. 274–276, 1992.

Yang et al., "Low–threshold operation of a GaAs single Quantum Well Mushroom structure surface–emitting laser," Appl. Phys. Lett. 58, pp. 1780–1782, Apr. 1991.

MacDougal et al., "Electrically–pumped Vertical Cavity Lasers with $Al_xO_y$/GaAs Reflectors," IEEE Photonics Technology Letters, vol. 8, No. 3, pp. 310–312, Mar. 1996.

Deppe et al., "Atom Diffusion and Impurity–Induced Layer Disordering in Quantum Well III–V semiconductor Heterostructures," J. App. Phys. vol. 64, pp. R93–R113, Dec. 15, 1988.

*Primary Examiner*—John F. Niebling
*Assistant Examiner*—S. Mulpuri
*Attorney, Agent, or Firm*—Jagtiani & Associates

[57] ABSTRACT

A method for fabricating a semiconductor device is provided in which a first layer having a first conductivity type is grown, a current aperture region comprising at least one layer of an oxidizable material is grown, a second layer is grown, an impurity material is diffused through a first region of the layer of oxidizable material to decrease the susceptibility to oxidation in the first region and to provide a conductive channel through the layer of oxidizable material, the semiconductor device is etched to expose a sidewall of the oxidizable layer, and the oxidizable layer is oxidized in a region outside of the first region to form an oxidized region while leaving at least a portion of the first region non-oxidized to form a current aperture in the oxidizable layer.

5 Claims, 3 Drawing Sheets

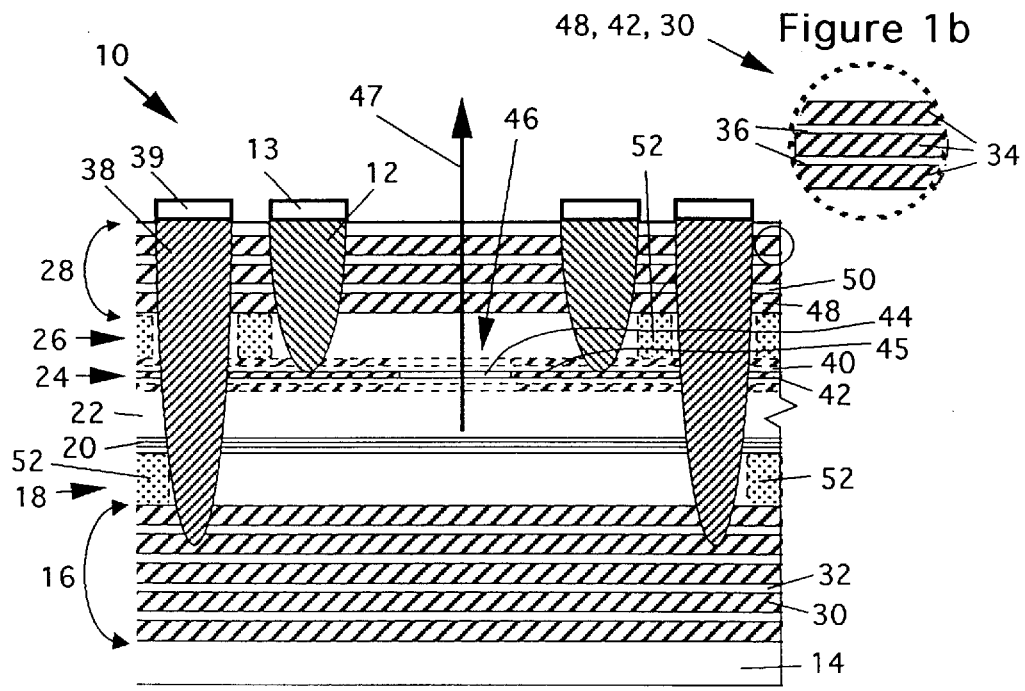
Figure 1a
Figure 1b
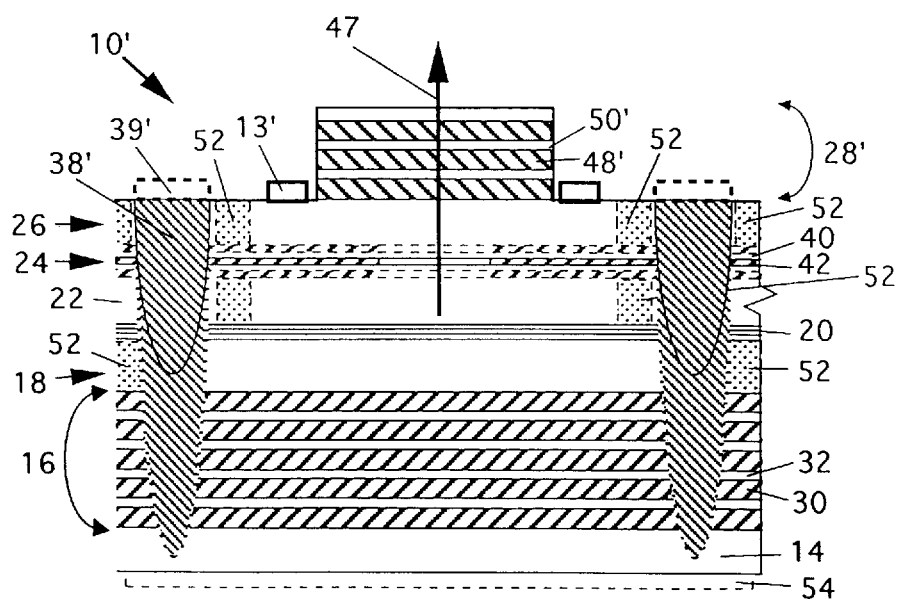
Figure 2

METHOD FOR FABRICATING A SEMICONDUCTOR DEVICE

This application is a Division of application Ser. No. 081659,942, filed Jun 7, 1996, U.S. Pat. No. 5,729,566.

"This invention is made with government support under contract number F49620-97-C-0068, awarded by the United States Department of Defense. The government may have certain rights in this invention."

CROSS-REFERENCE TO RELATED APPLICATIONS

This application makes reference to U.S. patent application Ser. No. 08/574,165, entitled "Conductive Element With Lateral Oxidation Barrier," filed Dec. 18, 1995. This application is hereby incorporated by reference.

BACKGROUND OF THE INVENTION

Field of the Invention

The present invention relates generally to light emitting devices, and more particularly to an improved light emitting device having a novel electrical contact through oxidized elements of the light emitting device.

Description of the Prior Art

Vertical-Cavity Surface-Emitting Lasers (VCSELs), Surface Emitting Lasers (SELs) or Light Emitting Diodes (LEDs) are becoming increasingly important for a wide variety of applications including optical interconnection of integrated circuits, optical computing systems, optical recording and readout systems, and telecommunications. Vertically emitting devices have many advantages over edge-emitting devices, including the possibility for wafer scale fabrication and testing, and the possibility of forming two-dimensional arrays of the vertically emitting devices. The circular nature of the light output beams from these devices also make them ideally suited for coupling into optical fibers as in optical interconnects or other optical systems for integrated circuits and other applications.

VCSELs or Surface Emitting Lasers SELs whose current flow is controlled by lateral oxidation processes show the best performances of any VCSELs in terms of low threshold current and high efficiency. In oxidized VCSELs the oxidation occurs in the lateral direction from the sides of etched mesas in the VCSEL wafers, typically under the conditions of 245° C. temperature with high water-vapor content. VCSELs or any other vertical light emitting devices employing laterally oxidized layers have been strictly limited only to structures which have been grown upon gallium arsenide (GaAs) substrates and emit light at wavelengths limited to the region bounded by 0.63 $\mu$m and 1.1 $\mu$m. For further details, see U.S. Pat. No. 5,493,577, by Choquette et al.

Another advantageous feature is to have one or both mirrors in which some of the layers are laterally oxidized layers. Such mirrors achieve very high reflectivities with a relatively small number of layers compared to all-semiconductor mirrors. For example, a 99.95% reflecting bottom mirror may be grown with 5 to 7 periods instead of the more usual 25 to 30 periods. Obviously, such mirrors have desirable features over the all-semiconductor mirrors, especially for longer wavelengths, such as wavelengths greater than 1.2 $\mu$m.

However there are disadvantages to having mirrors with laterally oxidized layers. For example, the layers are highly insulating and thus reduce electrical flow through the device. This results in the need to have multi-level etching and depositions to provide electrical contacts as is well known in the prior art. This need for multi-level etching at precise levels presents serious difficulties in the manufacturing of VCSELs having laterally oxidized layers.

Since VCSELs are presently the subject of intense research and development, a great deal of results and advancements are published monthly. The following is a summary of the prior art documents which are relevant to the problem of providing electrical contacts through laterally oxidized layers.

A limited form of lateral control of oxidation is reported in the publication by Dallesasse, et al. entitled "Hydrolyzation Oxidation of $Al_xGa_{l-x}As$-AlAs-GaAs Quantum Well Heterostructures and Superlattices," which appeared in Applied Physics Letters, volume 57, pp. 2844–2846, 1990. The same work is also described in U.S. Pat. No. 's 5,262,360 and 5,373,522, both by Holonyak and Dallesasse. In that work, GaAs-AlAs Superlattices were interdiffused in selected regions by impurity-induced layer disordering (IILD). The interdiffusion was essentially complete in the selected regions, thus the interdiffused regions comprised an AlGaAs compound having an Al concentration being approximately uniform and equal to the average Al concentration of the original constituent AlAs and GaAs layers. The oxidation proceeded through the superlattice regions but not significantly into the interdiffused regions. The superlattice was not doped and contained no other structure from which to fabricate any electronic or optoelectronic device. No attempt was made to form any kind of conductive aperture, channel or boundary.

Yang et al. in an article entitled "Continuous Wave Single Transverse Mode Vertical-Cavity Surface-Emitting Lasers Fabricated by Helium Implantation and Zinc Diffusion," which appeared in Electronics Letters, volume 28, pp. 274–276, 1992, disclosed a single transverse mode VCSEL fabricated by selective, helium (He) implantation and zinc diffusion. The He implantation was implemented with a mask to form a buried insulating layer around an active region to confine the current to a small area. The zinc diffusion was used to create a low series resistance path for current conduction. As may be seen in FIG. 1 of that article, the zinc layer does not penetrate completely through the p-doped AlGaAs layer above the He implantation in the active region. See also Yang et al. in an article entitled "Low-threshold operation of a GaAs single Quantum Well Mushroom structure surface-emitting laser," which appeared in Appl. Phys. Lett. 58, pp. 1780–1782, Apr. 1991.

MacDougal et al. in an article entitled "Electrically-pumped Vertical Cavity Lasers with $Al_xO_y$/GaAs Reflectors," which appeared in IEEE Photonics Technology Letters, Vol. 8, No. 3, pp. 310–312, March 1996, disclosed the use of oxide-based distributed Bragg reflectors (DBR's) on both sides of the gain region. MacDougal goes on to state that due to the insulating behavior of the oxide, p and n type conducting layers must be inserted between the mirrors and the cavity to form a current path into the gain region. Mesas are etched through the top DBR down to the p type GaAs conducting layer to allow for electrical connection.

SUMMARY OF THE INVENTION

It is therefore an object of the invention to provide a partially oxidized electrically conductive element in which at least one electrical contact is provided through a laterally oxidized layer.

It is another object of the invention to provide an oxidized VCSEL which is manufacturable.

In a first embodiment, the light emitting device comprises: a first conductive layer having a first conductivity type; a light emitting material, the light emitting material disposed above the first conductive layer and in electrical communication therewith; a current aperture region, the current aperture region comprising at least one layer of oxidizable material, the layer of oxidizable material having a first region which is non-oxidized surrounded by a second region which is oxidized in order to form a current aperture in the oxidizable material, the current aperture region further comprising a third region being non-oxidized and at least adjacent to the second region, the current aperture region disposed above the light emitting material and in electrical communication therewith; a second conductive layer having a second conductivity type, the second conductive layer being disposed above the current aperture region and in electrical communication therewith; at least one electrically conductive channel for providing electrical communication to the light emitting material, the channel extending through the third region of the oxidizable material.

In another embodiment, the light emitting device comprises: a first mirror, the first mirror having alternating layers having different refractive indices; a first conductive layer having a first conductivity type, the first layer disposed above the first mirror; a light emitting material, the light emitting material disposed above the first conductive layer and in electrical communication therewith; a current aperture region, the current aperture region comprising at least one layer of oxidizable material, the layer of oxidizable material having a first region which is non-oxidized surrounded by a second region which is oxidized in order to form a current aperture in the oxidizable material, the current aperture region disposed above the light emitting material and in electrical communication therewith; a second conductive layer having a second conductivity type, the second conductive layer being disposed above the current aperture region and in electrical communication therewith; a second mirror, the second mirror comprising at least one layer of oxidizable second mirror material and one layer of non-oxidizable second mirror material, the layer of oxidizable second mirror material having a first region in the second mirror which is non-oxidized and which is at least adjacent to a second region in the second mirror which is oxidized, the second region of the second mirror exhibiting a lower refractive index than a refractive index of the non-oxidizable second mirror material, the first and second mirrors and all material between forming an optical cavity having a cavity resonance at a nominal wavelength; at least one electrically conductive channel for providing electrical communication to the light emitting material, the channel extending through the first region of the second mirror and through at least one layer of the oxidizable material in the second mirror.

In yet another embodiment, the light emitting device comprises: a first mirror, the first mirror comprising at least one layer of oxidized material and one layer of non-oxidized material, the layer of oxidized material exhibiting a lower refractive index than a refractive index of the non-oxidized semiconductor material; a first conductive layer having a first conductivity type, the first layer disposed above the first mirror; a light emitting material, the light emitting material disposed above the first conductive layer and in electrical communication therewith; a current aperture region, the current aperture region comprising at least one layer of oxidizable material, the layer of oxidizable material having a first region which is non-oxidized surrounded by a second region which is oxidized in order to form a current aperture in the oxidizable material, the current aperture region further comprising a third region being non-oxidized and at least adjacent to the second region, the current aperture region disposed above the light emitting material and in electrical communication therewith; a second conductive layer having a second conductivity type, the second conductive layer being disposed above the current aperture region and in electrical communication therewith; a second mirror, the second mirror having alternating layers having different refractive indices, the first and second mirrors and all material between forming an optical cavity having a cavity resonance at a nominal wavelength; at least one electrically conductive channel for providing electrical communication to the light emitting material, the channel extending through the third region in the current aperture region.

In yet another embodiment, the light emitting device comprises: a first mirror, the first mirror comprising at least one layer of oxidizable first mirror material and one layer of non-oxidizable first mirror material, the layer of oxidizable first mirror material having a first region in the first mirror which is non-oxidized and which is at least adjacent to a second region in the first mirror which is oxidized, the second region of the first mirror exhibiting a lower refractive index than a refractive index of the non-oxidizable first mirror material; a first conductive layer having a first conductivity type, the first layer disposed above the first mirror; a light emitting material, the light emitting material disposed above the first conductive layer and in electrical communication therewith; a current aperture region, the current aperture region comprising at least one layer of oxidizable material, the layer of oxidizable material having a first region which is non-oxidized surrounded by a second region which is oxidized in order to form a current aperture in the oxidizable material, the current aperture region further comprising a third region being non-oxidized and at least adjacent to the second region, the current aperture region disposed above the light emitting material and in electrical communication therewith; a second conductive layer having a second conductivity type, the second conductive layer being disposed above the current aperture region and in electrical communication therewith; a second mirror, the second mirror comprising at least one layer of oxidizable second mirror material and one layer of non-oxidizable second mirror material, the layer of oxidizable second mirror material having a first region in the second mirror which is non-oxidized and which is at least adjacent to a second region in the second mirror which is oxidized, the second region of the second mirror exhibiting a lower refractive index than a refractive index of the non-oxidizable second mirror material, the first and second mirrors and all material between forming an optical cavity having a cavity resonance at a nominal wavelength; at least a first electrically conductive channel of a second conductivity type for providing electrical communication to the light emitting material, the channel extending through the at least one layer of oxidized material in the second mirror; at least a second electrically conductive channel of a first conductivity type for providing electrical communication to the light emitting material, the channel extending through the third region in the current aperture region.

Additionally, a method for fabricating a light emitting device in provided. The method comprises the steps of: growing a first layer having a first conductivity type; growing a light emitting material disposed above the first layer; growing a current aperture region, the aperture region comprising at least one layer of oxidizable material; growing a second layer having a second conductivity type; diff-using an impurity material through a first region, the diffusion decreasing the susceptibility to oxidization in the first region, the impurity providing an electrically conductive channel through the layer of oxidizable material; etching the light emitting device to expose a sidewall all of the oxidizable layers; and oxidizing the oxidizable layer in a region outside of the first region to form an oxidized region and leaving a portion nonoxidized to a form a current aperture in the oxidizable layer.

Other objects and features of the present invention will be apparent from the following detailed description of the preferred embodiments.

BRIEF DESCRIPTION OF THE DRAWINGS

The invention will be further described in conjunction with the accompanying drawings, in which:

FIG. 1a is a cross section of a light emitting device having multiple electrical contacts through multiple layers containing oxidized material which is constructed in accordance with a preferred embodiment of the invention;

FIG. 1b is an expanded view of an oxidized layer which is illustrated in FIG. 1a;

FIG. 2 is a cross section of a light emitting device having an electrical contact through at least one layer containing oxidized material which is constructed in accordance with an alternate embodiment of the invention;

FIG. 5 is a top view of an electrical contact site and interconnection metal and bond pads for the light emitting device of FIG. 1a; and FIG. 6 is a top view of an alternate embodiment of an electrical contact site and interconnection metal and bond pads for an alternate embodiment of the light emitting device of FIG. 1a.

DETAILED DESCRIPTION OF TEE PREFERRED EMBODIMENT

Figure 3:
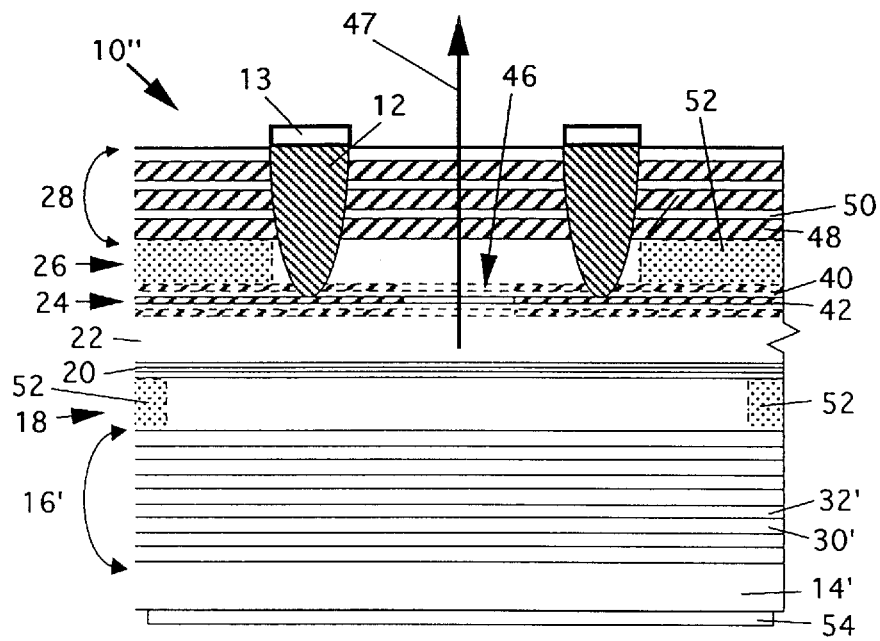
FIG. 3 is a cross section of a light emitting device having an electrical contact through at least one layer containing oxidized material which is constructed in accordance with yet another alternate embodiment of the invention.

With reference to the Figures, wherein like reference characters indicate like elements throughout the several views and, in particular, with reference to FIG. 1a, a cross section of a light emitting device 10 having an electrical channel 12 through at least one layer containing oxidized material is illustrated. Particularly, this FIG. 1a illustrates a vertical cavity surface emitting laser (VCSEL) having conductive channels disposed in the VCSEL for allowing electrical communication therewith. A preferred method for forming the conductive channel is by impurity induced layer disordering (IILD) or may be accomplished by ion implantation and annealing.

For a detailed discussion of impurity-induced layer disordering, see Deppe et al., in Atom Diffusion and Impurity-Induced Layer Disordering in Quantum Well III–IV semiconductor Heterostructures," J.App. Phys. Vol 64, pp. R93–R113, Dec. 15, 1988. The entire contents of this article is hereby incorporated by reference.

Turning now to FIG. 1a, light emitting device 10 comprises a substrate 14, a bottom mirror 16, a layer of semiconductor material 18, a light emitting material or active region 20, a second layer of semiconductor material 22, a current aperture region 24, a third layer of semiconductor material 26, and a top mirror 28. Light emitting device 10 will be described in greater detail below.

It should be appreciated that substrate 14 may be selected from numerous substrates know in the optics art. In particular, it is preferable to utilize a substrate that is either GaAs or InP. For light emission in the visible and near-infrared regions of the spectrum, substrate 14 is preferably gallium arsenide (GaAs). It should be appreciated that other substrates may be utilized. These substrates include, but are not limited to: GaP, InAs, GaSb or InSb. Finally, substrate 14 may be doped to provide electrical conductivity to the bottom of light emitting device 10. These substrates are well known in the art and therefore will not be described in any greater detail. Finally, it should be appreciated that a heat sink (not shown) may be attached to substrate 14 to allow for thermal conductivity from light emitting device 10.

Light emitting device 10 according to the present invention, may be formed from III–V compound semiconductor materials with embodiments of the invention preferably being in the form of a VCSEL or a LED formed from type III–V semiconductor materials. To form a light emitting device 10, namely a VCSEL, bottom mirror 16 is made highly reflective to provide a high quality factor.

Figure 4:
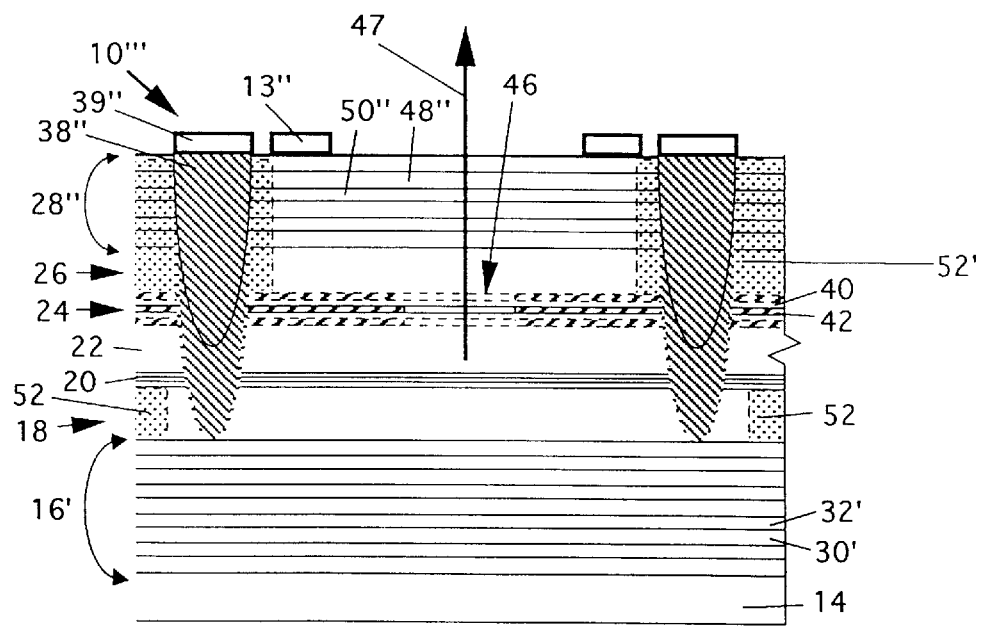
FIG. 4 is a cross section of a light emitting device having an electrical contact through at least one layer containing oxidized material which is constructed in accordance with yet another alternate embodiment of the invention.

Bottom mirror 16 comprises alternating layers 30 and 32, having different refractive indices. Bottom mirrors are preferably either conventional semiconductor mirrors comprising alternating semiconductor layers, or oxidized comprising alternating layers of non-oxidized semiconductor material and oxidized semiconductor material. Reference numeral 16 refers to bottom mirror having layers of oxidized semiconductor material. Since the oxidation occurs after growth of the active region, both types of mirror allow epitaxial growth of high quality active regions. In a preferred embodiment, layers 30 would have a refractive index between 3.0 and 3.5; and layers 32 would have a refractive index between 1.6 and 3.1. One feature of these mirrors is reflectivity of the mirror. In a preferred embodiment mirror 16 would have a reflectivity between 99.999% and 99.000%. Mirrors comprising alternating semiconductor layers are generally referred to as a Distributed Bragg Reflectors (DBR) and one is illustrated in FIGS. 3 and 4 as element 16'.

In the embodiments illustrated in FIGS. 1a and 2, mirror 16 will have layers 30 constructed from an oxidizable semiconductor material which is later oxidized during fabrication. The term oxidizable and oxidized are used consistently throughout the application and it should be appreciated that at least extensive parts of the oxidizable layers are oxidized during fabrication and thus produce oxidized regions. By an oxidizable material or layer, applicant means any group III–V material with sufficient aluminum (Al) content which may be oxidized significantly under the process for manufacturing device 10. By an oxidized semiconductor material or layer, applicant means any region of an Al bearing III–V material where oxygen has replaced the group V material in a proportion being greater than or equal to 90%.

Layers 30 may be selected from material such as, but not limited to: AlP, AlAsP, AlGaAs, AlGaAsP, AlAs, AlAsP, AlPSb, AlGaPSb, InAlAs, InAlGaAs, InAlGaAsP, AlAsSb, AlAsSbP, AlGaAsSb, InGaAlAsSbP, AlSb, AlPSb, AlGaP and InAlGaAsSb, or any combination thereof. Typically, Al will comprise at least 60% of the group-III material in oxidizable layer 30 as illustrated FIGS. 1 and 2. However, InAlAs grown on InP has ~48% Al for the group III material and may be considered oxidizable, albeit at a much higher temperature than required for AlAs. Due to the number of oxidizable layers 30 in some of the illustrations, oxidizable layers 30 are identified by drawing fill texture rather than by numbers. It should be appreciated that the terms oxidized and oxidizable are used consistently throughout the application with the definition provided above.

Layers 32 are preferably constructed of a semiconductor material which is non-oxidizable. It should be appreciated that any material, including material referred to as "non-oxidizable," may be oxidized, given a sufficiently high oxidization temperature and/or a long enough time. Therefore, applicant means that layers 32 resist oxidation to a great extent. This may be accomplished by the semiconductor material having a sufficient amount of oxidation inhibiting elements such as, but not limited to: Ga, In or P. By a non-oxidized semiconductor material, applicant means any III–V material where oxygen has replaced the group V material in a proportion being less than or equal to 10%. The term non-oxidizable and non-oxidized are used consistently throughout the application and it should be appreciated that the non-oxidizable layers are not extensively oxidized during fabrication and thus produce non-oxidized layers. For example, given that the semiconductor material has about 15% Ga and 85% Al, the resulting non-oxidized semiconductor material would oxidize about 2 orders of magnitude more slowly than the oxidized semiconductor material having 100% Al for the group III element. Finally it is to be appreciated that limited portions of non-oxidizable material may become oxidized. For example, the outer sidewalls of the non-oxidizable material may become oxidized.

For the oxidization process used in the preferred embodiment, it is preferable to maintain at least two times the oxidation rate between the oxidizable and non-oxidizable semiconductor materials. Layers 32 may be selected from material such as, but not limited to: GaAs, AlGaAs, InAlGaAs, InAlGaP, GaAsSb, GaPSb, AlGaPSb, InGaAs, or InGaAsP, AlPSb, AlGaP and InAlGaAsSb, or any combination thereof.

As may be seen in FIG. 1a, layers 30 and 32 may have a different thickness. In a preferred embodiment, layers 30 are much thicker than layers 32. For example, layers 30 have a thickness of between 0.03 $\mu$m and 0.2 $\mu$m for a GaAs substrate 14 and a thickness of between 0.06 $\mu$m and 0.4 $\mu$m for a InP substrate 14. Layers 32 have a thickness of between 0.03 $\mu$m and 0.2 $\mu$m for a GaAs substrate 14 and a thickness of between 0.06 $\mu$m and 0.4 $\mu$m for a InP substrate 14. In another preferred embodiment, layers 30 and 32 have approximately the same thickness in order to reduce the total amount of oxidized material in layer 30.

Turning now to FIG. 1b, an expanded view of an oxidized layer which is depicted in FIGS. 1a, 2 and 3 are illustrated. As may be seen, each oxidized layer comprises sublayers 34 and 36. Sublayers 34 are constructed of an oxidized semiconductor material while sublayers 36 are constructed of a non-oxidized semiconductor material. In a preferred embodiment, sublayers 34 have a thickness of between 10 Å and 2000 Å. Sublayers 36 have a thickness typically between 3 Å and 200 Å. It should be appreciated that sublayers 36 may be less than a monolayer of the atomic lattice of the material used for sublayers 36. The monolayer may contain some Al as well as some Ga while maintaining the property of being a non-oxidizable layer as defined above. Finally, in a preferred embodiment, there will be between 0 and 100 periods of sublayers 34,36 which comprise each layer 30. It should be appreciated that layer 30 may comprise non-uniform periods of sublayers 34,36.

One advantage of having sublayers 34,36 is that it greatly promotes the intermixing in layers 30, 42 and 48 within channels 12,38 during the IILD process. It should be appreciated that if layers 36 are thin enough, e.g., below 10 Å, then due to the large surface to volume ratio they may undergo significant oxidation in the regions which are not intermixed. In this case, the refractive index of the oxidized layers 30, 42 and 48 will not be largely different than it would be if the non-oxidized sublayers 36 were not present. Even if sublayers 36 do not oxidize at all, for an example where sublayers 36 is 15% of the layered material in layers 30, the overall effect upon the refractive index would only increase it from the nominal 1.6 to about 1.9.

In a preferred embodiment, mirror 16 has a thickness of between 0.2 $\mu$m and 6 $\mu$m for a GaAs substrate 14; and a thickness of between 0.3 $\mu$m and 15 $\mu$m for a InP substrate 14. Mirror 16 typically has between 19.5 and 60.5 periods if layer 30 is non-oxidized and between 1.5 and 19.5 periods if layer 30 is oxidized.

Disposed above mirror 16 is a layer of semiconductor material 18 which has a particular conductivity type, i.e., "p" or "n". It should be appreciated that a third layer of semiconductor material 26 has the opposite conductivity type as layer 18. Therefore, if layer 18 is a "n" type material, layer 26 is a "p" type material as is illustrated in FIG. 1a. If layer 18 is a "p" type material, layer 26 is a "n" type material as is illustrated in FIG. 2. In a preferred embodiment, layer 18 will have a thickness of between 0.04 $\mu$m and 2.0 $\mu$m if mirror 28 has oxidized layers. Otherwise, layer 18 will have a thickness of between 0.04 $\mu$m and 0.1 $\mu$m.

Preferably, layer 18 will be doped with an impurity having an average concentration between $1 \times 10^{16}$ and $1 \times 10^{20}$cm$^3$. It should be appreciated the concentration of the dopant may vary in either the longitudinal or transverse directions. The impurity may be selected from, but not limited to: C, Zn, Be, Mg, Si, Ge, S, Sn, and Se, or any combination thereof. The preferred dopant is dependent on whether layer 18 is "p" or "n" type and upon the III–V materials comprising layer 22. In a preferred embodiment, the semiconductor material layer 18 will have an electrical resistivity of at most $8 \times 10^{-4}$ $\Omega$cm, at 300° K., where the dopant is a "n" type material having a concentration of $3 \times 10^{18}$ and an electrical resistivity of at most $8 \times 10^{-3}$ $\Omega$cm, at 300° K., where the dopant is a "p" type material having a concentration of $1 \times 10^{19}$.

Disposed above layer 18 is an active region 20 which is primarily conventional in nature and thus will not be described in any detail. One of ordinary skill in the art of electro-optics will appreciate how to construct an active region. The only difference between active region 20 and a conventional active region, is that a conductive channel 38 may pass through active region 20. It should be appreciated that the active region may include a uniform layer composition, i.e., a bulk semiconductor layer; a gain layer surrounded by cladding layers; or it may include one or more quantum well layers surrounded by barrier layers, with the quantum well and barrier layers surrounded by cladding. The latter method is preferable for a VCSEL. For the purpose of this application, a quantum well is defined as a semiconductor layer providing a quantum confinement of electrons and holes therein and also includes semiconductor layers comprising a plurality of quantum wires or dots therein.

Disposed above active region 20 is the second layer of a semiconductor material 22 which is preferably undoped or doped with the opposite conductivity type as layer 18. Therefore, if layer 18 is a "n" type material, layer 22 may be a "p" type material as is illustrated in FIG. 1a. If layer 18 is a "p" type material, layer 22 may be a "n" type material as is illustrated in FIG. 2. In a preferred embodiment, layer 22 will have a thickness of between 0.01 μm and 1.0 μm if mirror 28 has oxidized layers. Otherwise, layer 22 will have a thickness of between 0.01 μm and 0.8 μm.

Preferably, layer 22 will be doped with an impurity having an average concentration between $1\times10^{12}$ and $1\times10^{17}$cm$^3$, i.e., lightly doped. It should be appreciated that there may be a gradient in the concentration of the dopant which varies in either the longitudinal or transverse directions. The impurity may be selected from, but not limited to: C, Zn, Be, Mg, Si, Ge, S, Sn, and Se, or any combination thereof. The preferred dopant is dependent on whether layer 22 is "p" or "n" type and upon the III–V material comprising layer 22.

Disposed above the second layer of a semiconductor material 22 is the current aperture region 24 which comprises alternating layers of semiconductor material 40 and oxidizable semiconductor material 42. As illustrated in FIG. 1a, 2, 3 and 4, current aperture region 24 must comprise at least one period, but may be constructed from several periods as illustrated by the dashed lines which show additional periods. Layers 40 are preferably constructed of a semiconductor material which is non-oxidizable. Layers 40 may be selected from material such as, but not limited to: GaAs, AlGaAs, InAlGaAs, InAlGaP, GaAsSb, GaPSb, AlGaPSb, InGaAs, or InGaAsP, AlPSb, AlGaP and InAlGaAsSb, or any combination thereof.

Layers 42 are preferably constructed of a semiconductor material which is oxidizable. Layers 42 may be selected from material such as, but not limited to: AlP, AlAsP, AlGaAs, AlGaAsP, AlAs, AlAsP, AlPSb, AlGaPSb, InAlAs, InAlGaAs, InAlGaAsP, AlAsSb, AlAsSbP, AlGaAsSb, InGaAlAsSbP, AlSb, AlPSb, AlGaP and InAlGaAsSb, or any combination thereof. Typically, Al will comprise at least 60% of the group-III material in oxidizable layer 30 as illustrated FIGS. 1 and 2. However, InAlAs grown on InP has ~48% Al for the group III material and may be considered oxidizable, albeit at a much higher temperature than required for AlAs. Preferably, layers 42 have a thickness of between 0.005 μm and 0.3 μm. As may be seen, each layer 42 has a non-oxidized region 44 and oxidized region 45 to form a current aperture 46. Preferably, oxidized region 45 is annular in shape. In operation, light emitting device 10 emits light beam 47 approximately aligned with current aperture 46.

Disposed above current aperture region 24 is the third layer of semiconductor material 26 having the opposite conductivity type as layer 18. Therefore, if layer 18 is a "n" type material, layer 26 may be a "p" type material as is illustrated in FIG. 1a. If layer 18 is a "p" type material, layer 26 may be a "n" type material as is illustrated in FIG. 2. In a preferred embodiment, layer 26 will have a thickness of between 0.01 μm and 1.0 μm if mirror 28 has oxidized layers. Otherwise, layer 26 will have a thickness of between 0.01 μm and 0.8 μm.

Preferably, layer 26 will be doped with an impurity having an average concentration between $1\times10^{16}$ and $1\times10^{21}$cm$^3$, i.e., highly doped. It should be appreciated that there may be a gradient in the concentration of the dopant which varies in either the longitudinal or transverse directions. The impurity may be selected from, but not limited to: C, Zn, Be, Mg, Si, Ge, S, Sn, and Se, or any combination thereof. The preferred dopant is dependent on whether layer 26 is "p" or "n" type and upon the material comprising layer 26. In a preferred embodiment, the semiconductor material layer 26 will have an electrical resistivity of at most $8\times10^{-4}$ Ωcm, at 300° K., where the dopant is a "n" type material having a concentration of $3\times10^{18}$ and an electrical resistivity of at most $8\times10^{-3}$ Ωcm, at 300° K., where the dopant is a "p" type material having a concentration of $1\times10^{19}$.

Disposed above the third layer of semiconductor material 26 is the top mirror 28 comprising alternating layers 48 and 50, having different refractive indices. Top mirror 28 may be a conventional semiconductor mirror comprising alternating semiconductor layers, or oxidized comprising alternating layers of non-oxidized semiconductor material and oxidized semiconductor material. Additionally top mirror 28 may comprise dielectric and/or metallic materials since epitaxial growth above them is not generally necessary. It should be appreciated that the two general types of bottom mirrors 16 and three general types of top mirrors 28 yield six general configurations, some of which are illustrated in FIGS. 1a, 2 and 3. These six general configurations are illustrated in U.S. patent application Ser. No. 08/574,165, entitled "Conductive Element With Lateral Oxidation Barrier," filed Dec. 18, 1995. This application is hereby incorporated by reference. Additionally, each mirror may comprise a combination of these general types, for example, top mirror 28 may comprise conventional semiconductor layers, i.e., a DBR, oxidized layers, dielectric layers and metallic layers.

In a preferred embodiment, layers 48 would have a refractive index between 3.0 and 3.5; and layers 50 would have a refractive index between 1.6 and 3.1. One feature of these mirrors is reflectivity of the mirror. In a preferred embodiment mirror 28 would have a reflectivity between 99.999% and 99.000%. Mirrors comprising alternating semiconductor layers are generally referred to as DBRs and one is illustrated in FIG. 4 as element 28". Reference numeral 28 refers to top mirror having layers of oxidized semiconductor material and 28' refers to top mirror having dielectric layers.

In the embodiments illustrated in FIGS. 1a and 3, mirror 28 will have layers 48 constructed from an oxidized semiconductor material. Before oxidization, layers 48 may be selected from material such as, but not limited to: AlP, AlAsP, AlGaAs, AlGaAsP, AlAs, AlAsP, AlPSb, AlGaPSb, InAlAs, InAlGaAs, InAlGaAsP, AlAsSb, AlAsSbP, AlGaksSb, InGaAlAsSbP, AlSb, AlPSb, AlGaP and InAlGaAsSb, or any combination thereof Typically, Al will comprise at least 60% of the group-III material in oxidizable layer 30 as illustrated FIGS. 1 and 2. However, InAlAs grown on InP has ~48% Al for the group III material and may be considered oxidizable, albeit at a much higher temperature than required for AlAs. Due to the number of oxidizable layers 48 in some of the illustrations, oxidizable layers 48 are identified by drawing fill texture rather than by numbers.

Layers 50 are preferably constructed of a semiconductor material which is non-oxidizable. Layers 50 may be selected from material such as, but not limited to: GaAs, AlGaAs, IAlGaAs, InAlGaP, GaAsSb, GaPSb, AlGaPSb, InGaAs, or InGaAsP, AlPSb, AlGaP and InAlGaAsSb, or any combination thereof.

As may be seen in FIG. 1a, layers 48 and 50 may have a different thickness. In a preferred embodiment, layers 48 are much thicker than layers 50. For example, layers 48 have a thickness of between 0.03 μm and 0.2 μm for a GaAs substrate 14 and a thickness of between 0.06 μm and 0.4 μm for a InP substrate 14. Layers 50 have a thickness of between 0.03 μm and 0.2 μm for a GaAs substrate 14 and a thickness of between 0.06 μm and 0.4 μm for a Inp substrate 14. In another preferred embodiment, layers 48 and 50 have approximately the same thickness in order to reduce the total amount of oxidized material in layer 48.

Turning now to FIG. 1*b*, an expanded view of an oxidized layer which is depicted in FIG. 1*a* is illustrated. As may be seen, each oxidized layer comprises sublayers 34 and 36. Sublayers 34 are constructed of an oxidized semiconductor material while sublayers 36 are constructed of a non-oxidized semiconductor material. In a preferred embodiment, sublayers 34 have a thickness of between 10 Å and 2000 Å. Sublayers 36 have a thickness of typically between 3 Å and 200 Å. It should be appreciated that sublayers 36 may be less than a monolayer of the atomic lattice of the material used for sublayers 36. The monolayer may contain some Al as well as some Ga while maintaining the property of being a non-oxidizable layer as defined above. Finally, in a preferred embodiment, there will be between 0 and 100 periods of sublayers 34,36 which comprise each layer 48. It should be appreciated that layers 48 may comprise non-uniform periods of sublayers 34,36.

In a preferred embodiment, mirror 28 has a thickness of between 0.1 $\mu$m and 3 $\mu$m for a GaAs substrate 14; and a thickness of between 0.2 $\mu$m and 7 $\mu$m for a InP substrate 14. Mirror 28 typically has between 1 and 30 periods if layer 48 is non-oxidized and between 1 and 10 periods if layer 48 is oxidized.

Generally, the number of periods in top mirror 28 is less than that of bottom mirror 16 to reduce reflectivity and allow light emission from light emitting device 10 in a vertical direction as shown by the arrow in FIG. 1*a*. Alternatively, if the direction of light emission is to be vertically downward through substrate 14, then the number of mirror periods may be higher for top mirror 28 than bottom mirror 16.

Current blocks 52 are disposed in the third layer of semiconductor material 26 and between a bottom of mirror 28 and a top of aperture region 24. Current blocks 52 are provided to preventing electrical leakage from channels 12,38 in the third layer of semiconductor material 26. Current blocks 52 comprise material that is highly non-conductive, for example, at least 2 times less conductive that the layer in which it resides. If the semiconductor material region in which current block 52 resides is GaAs, then the region in which current block 52 resides will have an electrical resistivity of at least $16 \times 10^{-4}$ $\Omega$cm, at 300° K., where the dopant is a "n" type material having a concentration of $3 \times 10^{18}$ and an electrical resistivity of at least $16 \times 10^{-3}$ $\Omega$cm, at 300° K., where the dopant is a "p" type material having a concentration of $1 \times 10^{19}$. The GaAs semiconductor material layers 18,26 outside of current block 52 will have an electrical resistivity of at most $8 \times 10^{-4}$ $\Omega$scm, at 300° K., where the dopant is a "n" type material having a concentration of $3 \times 10^{18}$ and an electrical resistivity of at most $8 \times 10^{-3}$ $\Omega$cm, at 300° K., where the dopant is a "p" type material having a concentration of $1 \times 10^{19}$.

Figure 5:
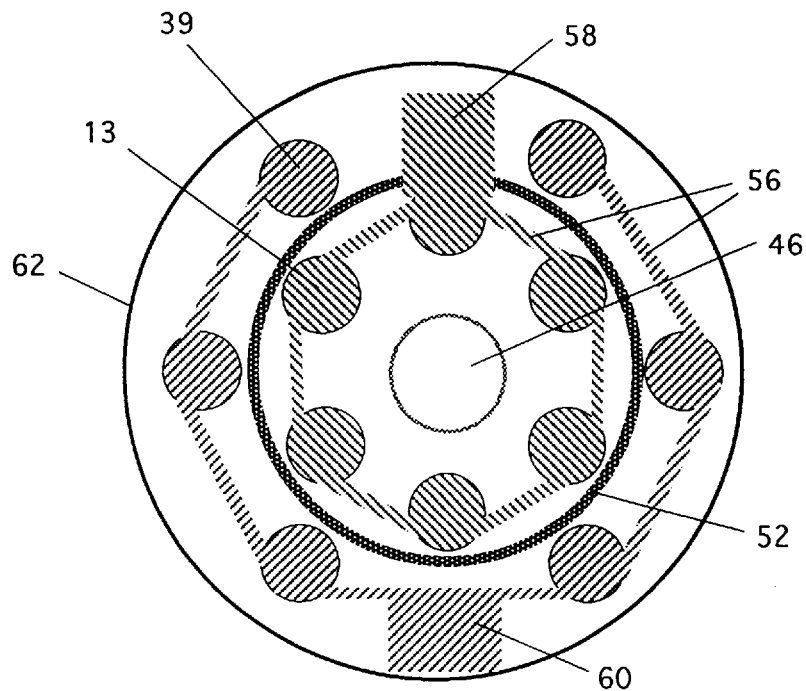
Figure 6:
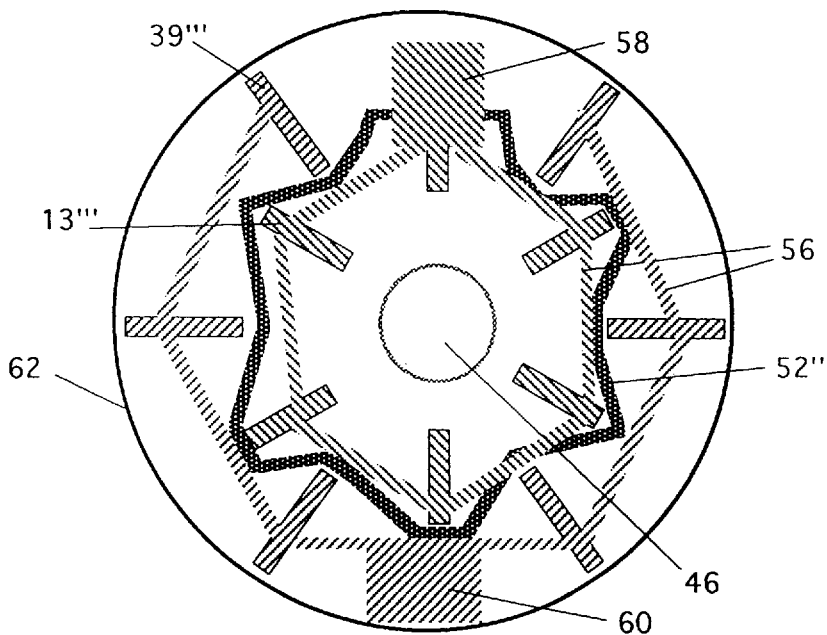

These blocks 52 may be made from: (1) an undoped material, for example, layer 22; (2) an implantation or diffusion of a species of a type opposite to the type in layer 26, or (3) implantation or diffusion of a non-conductive species. In the $2^{nd}$ case, if layer 26 is "p" type with a Carbon doping, the implant for the current block could be, but not limited to: Si, Ge, or Te, or any combination thereof. In the $3^{rd}$ case, the nonconductive species may be, but not limited to: oxygen, hydrogen or any other nonconductive species know in the art. It should be appreciated that for any of the implantation approaches, described above, it is necessary that the current blocking conditions will remain intact throughout the remainder fabrication process. Since current leakage is generally not an issue in a semiconductor material which has low or no doping, such as layer 22, generally, there is no need to have a current block. Finally, it should be appreciated that current blocks 52 may be utilized in layers 18 and/or 22 in combination with or without the current blocks in layer 26. As may be seen in FIG. 1*a*, current block 52 may completely surround channel 38 in layer 26. Thus, electrical isolation is provided between channels 38 and 12. FIGS. 5 and 6 illustrate another configuration of current blocks 52 which isolate channels 12,38 residing beneath respective electrodes 13,39. Current blocks 52 may also be formed by etching.

Channels 12,38 are preferably formed by an IILD process as discussed by Deppe et al., in Atom Difffusion and Impurity-Induced Layer Disordering in Quantum Well III–V semiconductor Heterostructures," J.App. Phys. Vol 64, pp. R93–R113, Dec. 15, 1988. The entire contents of this article has been incorporated by reference. These channels may be formed by an impurity is selected from the group consisting of: Zn, Be, Mg, Si, Ge, S, Sn, and Se, or any combination thereof. Preferably, Zn will be utilized in channel 12 where layer 26 is a "p" type semiconductor material and Si will be utilized in channel 38 where layer 18 is an "n" type semiconductor material. It should be appreciated that the materials for channels 12,38 may be interchanged if the type in layers 18,26 are interchanged. It is required that channel 38 extend through layer 42 and preferably through active region 20 to maximize electrical contact with active region 20 through layer 18. It should be appreciated that channel 38 may extend into mirror 16 and that there is no significant effect on device 10 since channel 38 lies well outside of the central region, defined by current aperture 46, where the optical field is strong. If present, channel 12 must extend into layer 26 above aperture region 24, but must not significantly penetrate through the tin oxidized region 45 of aperture region 24. Electrodes 13,39 are provided at surfaces of channels 12, 38, respectively. These electrodes 13,39 allow for electrical contact to channels 12,38, respectively. These electrodes 13,39 are deposited and preferably annealed to form electrical contacts to channels 12 and 38, respectively. Electrodes 13,39 are preferably located outside of the location of light beam 47.

Turning now to FIG. 2, an alternate embodiment of the light emitting device 10 is illustrated as element 10'. For clarity, like elements have been provided with like reference numerals except that a prime has been added in cases of functional or structural changes. The following discussion will focus on the differences between elements of this embodiment and that of the preferred embodiment.

As may be seen, in this embodiment, top mirror 28' comprises low index layers 48' and high index layers 50' and forms a mesa. Top mirror 28' may be an oxidized mirror as described above or may be a dielectric mirror or may be a conventional DBR semiconductor mirror, or any combination thereof. It should be appreciated that if mirror 28' is dielectric, the number of periods for mirror 28' may be greater than that for an oxidized mirror.

Since electrodes 13' may be placed in direct contact with layer 26, there is no need for conductive channel 12. As may be seen, only one channel 38' is provided in this embodiment. Channel 38' extends from the top surface of layer 26 to at least below layer 42 and preferably into layer 18. As illustrated, this channel 38' may extend into bottom mirror 16. Furthermore, channel 38' may extend into substrate 14. In this case, it may be advantageous for substrate 14 to be doped with a first conductive type and to deposit contact 54 onto substrate 14 as illustrated in FIG. 2. If electrode 54 is present, it should be appreciated that the presence of electrode 39' is optional and if electrode 39' is present, then electrode 54 is optional.

Turning now to FIG. 3, an alternate embodiment of the light emitting device 10 is illustrated as element 10". As may be seen, in this embodiment, substrate 14' is doped with a dopant to allow electrical conductivity therethrough. A contact 54 is provided below substrate 14' and thus, there is no need for channel 38 in this embodiment. Mirror 16' is a conventional semiconductor mirror which is doped and has the same conductivity type "p" or "n" as substrate 14' and thus has more periods than oxidized mirror 16. In this embodiment, layers 30' are preferably constructed from a low index semiconductor material and layers 32' are preferably constructed from a high index semiconductor material.

Turning now to FIG. 4, an alternate embodiment of the light emitting device 10 is illustrated as element 10'''. As may be seen, in this embodiment, mirror 28" is a conventional semiconductor mirror comprising low-index layers 48" and high-index layers 50" as illustrated. Since mirror 28" does not have oxidized layers, mirror 28" may be doped of the same type dopant as layer 26. Electrodes or contacts 13" may be placed directly on the surface of mirror 28". Current blocks 52' are not only disposed in layer 26 but also mirror 28". Finally, as may be seen by the dashed channel 38", the channel 38" may extend beyond layer 22 and preferably extends into layer 18. In this embodiment, mirror 16' is a conventional semiconductor mirror. If mirror 16' were an oxidized mirror 16, then , channel 38" could extend into mirror 16. It is preferable to prevent channel 38" from entering mirror 16' since there would be current leakage. It should be appreciated that this current leakage could be confined with a current block 52' as used in mirror 28". If mirror 28" is non-conductive, electrical contact between electrode 13" and layer 26 may be provided by a channel similar to channel 12. It is preferred that low-index layers 48" have a lower susceptibility to oxidation than oxidizable semiconductor material 42. It is to be appreciated that even if low-index layers 48" are "non-oxidizable" their outer sides may become oxidized during the fabrication process, but over a lateral extent less than for layers 42.

Turning now to FIG. 5, electrodes 13,39 and interconnection metal 56 and bond pads 58,60 for light emitting device 10 of FIG. 1a are illustrated. As may be seen, interconnect metal 56 provides connection between bond pads 58,60 and respective electrodes 12,39 which in turn connect to respective channels 12, 38. As may be seen, electrodes 13,39 and channels 12,38 do not completely surround aperture 46 so that oxidation is not stopped before forming current aperture 46. FIG. 5 illustrates a radial symmetry for electrodes 13,39 and channels 12,38 and interconnection metal 54 about aperture 46. This symmetry helps promote uniform symmetric current flow through aperture 46. It should be appreciated that multiple channels 12,38 may each be addressed from a single site such as wire bond pads 58,60 or may be addressed individually. Channels 12 and electrodes 13 may be staggered with respect to channels 38 and electrodes 39, as shown, or may be aligned radially. In a preferred embodiment, channels 12,38 will have diameters between 5 μm and 10 μm. It should be appreciated that channels 12,38 need not have a circular cross section (see discussion on FIG. 6 below). When etched sidewall 62 completely surrounds light emitting device 10, it is not necessary for current block 52 to reside outside of channels 38.

Turning now to FIG. 6, an alternate embodiment of electrodes 13',39' and interconnection metal 56 and bond pads 58,60 for light emitting device 10 of FIG. 1a is illustrated. For clarity, like elements have been provided with like reference numerals except that a prime has been added in cases of functional or structural changes. The following discussion will focus on the differences between elements of this embodiment and that of the preferred embodiment.

As maybe seen, electrodes 13''' and 39''' corresponding to channels 12 and 38 have a narrow rectangular shape which has the longer length segment being oriented radially outwardly from current aperture 46. This particular orientation provides the ability to maximize the contact area between channels 12,38 and respective layers 26,18 while minimizing the blockage of the lateral oxidation process which forms current aperture 46. As may be seen current block 52" has a non-circular shape about current aperture 46. This shape is provided to be representative of numerous shapes which may be utilized in conjunction with the inventive concepts of the invention.

It should be appreciated that the light emitting devices 10, 10', 10" and 10''' illustrated in FIGS. 1a, 2, 3 and 4 may be VCSELs or LEDs. In the case of LEDs, some elements depicted may be deleted, for example one or both of the mirrors 16,28. Furthermore, substrate 14 may be deleted for any configuration of either VCSEL or LED. The examples shown in FIGS. 1a, 2, 3 and 4 are not meant to limit the present invention to only the precise configurations illustrated. For example, if the light emitters emit light downward through the substrate, a metal layer may be added to the top mirror to provide increased reflectivity with minimal layers.

Turning now to the fabrication of light emitting device 10, fabrication of oxide VCSELs are well known in the prior art. Therefore, only a detailed description of the fabrication process for device 10 will be provided below. It should be appreciated that the alternative embodiments may be constructed by eliminating or modifying the steps described below in an obvious manner associated with the elements present in the particular embodiment.

The bottom mirror stack 16 is expitaxially grown on substrate 14 by metal-organic chemical vapor deposition (MOCVD), molecular beam epitaxy (MBE) or the like. Bottom mirror 16 is comprised of a plurality of mirror periods forming a distributed Bragg reflector (DBR). The mirror periods are formed by alternating the growth of high-index and low-index semiconductor or oxidizable layers 32,30 as shown in FIG. 1a. For oxidizable layers, layers 30 have a higher Al content than the Al content of layer 32. In this manner, layer 30 is oxidizable and layer 32 is non-oxidizable, as defined above.

The eptiaxial growth of bottom mirror 16 is generally terminated with a low-index layer 30. In some instances, however, the growth may be terminated with a high-index layer 32. It should be appreciated that layers 30 may be constructed from an oxidizable material as illustrated in FIGS. 1a and 2. In the alternative, layers 30 may be conventional semiconductor material as is illustrated in FIGS. 3 and 4. In this case, the bottom mirror 16' may be doped to provide electrical conductivity of a first conductivity type, which should be the same conductivity type as substrate 14' if a bottom contact 54 is desired.

The reflectivities of the top and bottom mirror stacks 28,16 may be defined during epitaxial growth of light emitting device 10 by adjusting the number of mirror periods in each mirror stack, by adjusting the semiconductor alloy compositions of a high-index semiconductor layer and a low-index semiconductor layer forming each period, and/or by oxidizing select layers in each mirror stack. The optical gain in light emitting device 10 may also be adjusted during epitaxial growth by providing either a bulk or quantum well active region 20. The number and location of quantum wells in the active region 20 any further provide means for increasing the optical gain by maximizing a spatial overlap with an electric field in the optical cavity.

The next step involves the growing first layer 18 having a first conductivity type and in communication with bottom mirror 16. This is accomplished by epitaxial growth and then doped with an impurity having an average concentration between $1\times10^{16}$ and $1\times10^{20} cm^3$. It should be appreciated that the concentration of the dopant may vary in the longitudinal direction. The impurity may be selected from, but not limited to: C, Zn, Be, Mg, Si, Ge, S, Sn, and Se, or any combination thereof. The preferred dopant is dependent on whether layer 18 is "p" or "n" type and upon the III–V materials comprising layer 18. In a preferred embodiment, the semiconductor material layer 18 will have an electrical resistivity of at most $8\times10^{-4}$ Ωcm, at 300° K., where the dopant is a "n" type material having a concentration of $3\times10^{18}$ and an electrical resistivity of at most $8\times10^{-3}$ Ωcm, at 300° K., where the dopant is a "p" type material having a concentration of $1\times10^{19}$.

Light emitting material 20 in communication with first layer 18 is grown in a conventional manner. Next a second layer 22 is expitaxially grown above the light emitting material 20.

Next, a current aperture region 24 is grown with non-oxidizable layer 40 and oxidizable layer 42.

The next step involves the growing third layer 26 having a second conductivity type and in communication with current aperture region 24. This is accomplished by epitaxial growth and then doping with an impurity having an average concentration between $1\times10^{16}$ and $1\times10^{20} cm^3$. It should be appreciated that there may be a gradient in the concentration of the dopant which varies in either the longitudinal or transverse directions. The impurity may be selected from, but not limited to: C, Zn, Be, Mg, Si, Ge, S, Sn, and Se, or any combination thereof. The preferred dopant is dependent on whether layer 26 is "p" or "n" type and upon the III–V materials comprising layer 26. In a preferred embodiment, the semiconductor material layer 26 will have an electrical resistivity of at most $8\times10^{-4}$ Ωcm, at 300° K., where the dopant is a "n" type material having a concentration of $3\times10^{18}$ and an electrical resistivity of at most $8\times10^{-3}$ Ωcm, at 300° K., where the dopant is a "p" type material having a concentration of $1\times10^{19}$.

Finally, top mirror 28 may be expitaxially grown on layer 26 by metal-organic chemical vapor deposition (MOCVD), molecular beam epitaxy (MBE) or the like. Top mirror 28 comprises a plurality of mirror periods forming a distributed Bragg reflector DBR). The mirror periods are formed by alternating the growth of high-index and low-index semiconductor, dielectric or oxidizable layers 48,50 as shown in FIG. 1a For oxidizable layers, layers 48 have a higher Al content than the Al content of layer 50. In this manner, layer 48 is oxidizable and layer 50 is non-oxidizable, as defined above.

The growth of top mirror 28 is generally terminated with a high-index layer 50. It should be appreciated that layers 48 may be constructed from an oxidizable material as illustrated in FIGS. 1a and 3. In the alternative, layers 48 may be dielectric as in FIG. 2, or conventional semiconductor material as is illustrated in FIG. 4.

Next, a mask is applied to select areas of light emitting device 10 to allow for diffusing of an impurity material having a first conductivity type through top mirror 28, and through current aperture region 24. It should be appreciated that the diffusion process decreases the susceptibility to oxidization in select regions of top mirror 28 and current aperture region 24. The impurity provides electrically conductive channel 12 through top mirror 28 to layer 26. Preferably, if there are two channels 12,38 then the channel associated with the higher temperature process is conducted first. For example, if Si and d Zn are used for the respective channels 12,38, then channel 12, i.e., the silicon channel, will be formed first.

Current blocks 52 are then formed by ion implantation, diffusion or etching.

Etching of the light emitting device 10 is conducted to expose oxidizable layers along edge 58. Etching may be performed by a wet or dry etching process such as relative ion etching (REI), reactive ion beam etching (RIBE), or the like. In forming the mesa, the etch depth may be measured in-situ by reflectometry to provide a precise control of the etch depth, and to allow the etch process to be stopped after etching down at least to bottom mirror 16, if oxidizable layers are present therein. In some instances, it may be preferable to etch down to substrate 14 and to provide more vertical sidewalls for the mesa for uniform oxidation of one or more oxidizable layers, i.e., etch both sides of device 10.

Next, oxidizing of oxidizable layers 30,42 and 50 in a region outside of the select regions 46 in order to form oxidized layers is conducted. This process is carried out at ~425° C. for 4 hours for AlAs; or ~625° C. for 6 hours for InAlAs.

Finally, Electrodes 13,39 are preferably deposited above channels 12,38, respectively. Electrodes 13,39 may be formed from an opaque metallization, i.e., optically thick; a semi-transparent metallization, e.g., indium-tin-oxide; or a metallization pattern to define a central opening of the optical cavity of light emitting device 10. It should be appreciated that the method selected will depend upon the specific location of electrodes 13,39. These electrodes 13,39 are preferably annealed. Then a pattern is laid for depositing interconnect metal 56 and bond pads 58,60.

Although the present invention has been fully described in connection with the preferred embodiment thereof with reference to the accompanying drawings, it is to be noted that various changes and modifications are apparent to those skilled in the art. Such changes and modifications are to be understood as included within the scope of the present invention as define by the appended claims, unless they depart therefrom.

What is claimed is:

1. A method for fabricating a light emitting semiconductor device, the method comprising the steps of:

growing a first layer having a first conductivity type;

growing a light emitting material disposed above said first layer:

growing a current aperture region proximal to said light emitting material, said aperture region comprising at least one layer of oxidizable material;

growing a second semiconductor layer above said light emitting material;

diffusing an impurity material through a first region of said layer of oxidizable material, said diffusion decreasing the susceptibility to oxidization in said first region of said layer of oxidizable material, said impurity providing an electrically conductive channel through said layer of oxidizable material;

etching said light emitting semiconductor device to expose a sidewall of at least one layer of said oxidizable layers; and oxidizing said oxidizable layer in a region outside of said first region to form an oxidized region and leaving at least a portion of said first region non-oxidized to a form a current aperture in said oxidizable layer.

2. The method recited in claim 1, further comprising the steps of:

growing first and second mirrors, said first mirror grown before said first layer is grown, said second mirror grown after said second layer is grown.

3. The method recited in claim 2, wherein the step of growing said second mirror comprises the step of:

growing at least one layer of oxidized material and one layer of non-oxidized material.

4. The method recited in claim 2, wherein the step of growing said first mirror comprises the step of:

growing at least one layer of oxidized material and one layer of non-oxidized material.

5. The method recited in claim 1, further comprising the step of: forming at least one non-conducting region in said light emitting device.

* * * * *